(12) United States Patent
Chen et al.

(10) Patent No.: US 9,570,365 B2
(45) Date of Patent: Feb. 14, 2017

(54) DISPLAY DEVICE AND TEST PAD THEREOF

(71) Applicant: InnoLux Corporation, Miao-Li County (TW)

(72) Inventors: Hung-Kun Chen, Miao-Li County (TW); Yu-Ti Huang, Miao-Li County (TW); Hong-Kang Chang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/643,169

(22) Filed: Mar. 10, 2015

(65) Prior Publication Data

US 2015/0262897 A1   Sep. 17, 2015

Related U.S. Application Data

(60) Provisional application No. 61/952,929, filed on Mar. 14, 2014, provisional application No. 61/989,046, filed on May 6, 2014.

(30) Foreign Application Priority Data

Sep. 24, 2014   (TW) .............................. 103132928 A

(51) Int. Cl.
| | |
|---|---|
| *H01L 23/58* | (2006.01) |
| *H01L 21/66* | (2006.01) |
| *G02F 1/1368* | (2006.01) |
| *G02F 1/1362* | (2006.01) |
| *G09G 3/00* | (2006.01) |
| *G02F 1/1345* | (2006.01) |

(52) U.S. Cl.
CPC ............. *H01L 22/32* (2013.01); *G02F 1/1368* (2013.01); *G02F 2001/13456* (2013.01); *G02F 2001/136254* (2013.01); *G09G 3/006* (2013.01)

(58) Field of Classification Search
CPC .... H01L 22/32; G02F 1/13452; G02F 1/1309; G09G 3/006
USPC .......................................... 257/48
See application file for complete search history.

(56) References Cited

U.S. PATENT DOCUMENTS

| 6,683,671 B1 | 1/2004 | Morimoto |
|---|---|---|
| 6,870,591 B2 | 3/2005 | Lee et al. |

(Continued)

FOREIGN PATENT DOCUMENTS

| CN | 102346339 | 2/2012 |
|---|---|---|
| CN | 102749731 | 10/2012 |

(Continued)

OTHER PUBLICATIONS

Chinese language office action dated Dec. 16, 2015, issued in application No. TW 103137142.

(Continued)

*Primary Examiner* — Brook Kebede
(74) *Attorney, Agent, or Firm* — McClure, Qualey & Rodack, LLP

(57) ABSTRACT

The present disclosure provides a display device, including: a display region; and a non-display region adjacent to the display region, wherein the non-display region includes: a gate-driving circuit; a driving unit; and a test pad, wherein the driving unit electrically connects the gate-driving circuit through the test pad. The present disclosure also provides a test pad.

20 Claims, 8 Drawing Sheets

(56) References Cited

U.S. PATENT DOCUMENTS

| | | |
|---|---|---|
| 7,379,142 B2 | 5/2008 | Tak et al. |
| 7,508,481 B2 | 3/2009 | Whitehead, Jr. et al. |
| 7,924,393 B2 | 4/2011 | Fukuoka et al. |
| 9,151,994 B2 | 10/2015 | Chang et al. |
| 9,176,339 B2 | 11/2015 | Kim et al. |
| 2002/0140887 A1 | 10/2002 | Maeda et al. |
| 2005/0157245 A1 | 7/2005 | Lin et al. |
| 2006/0209235 A1 | 9/2006 | Kim |
| 2006/0284643 A1* | 12/2006 | Yamamoto ............. G09G 3/006 324/760.01 |
| 2008/0170195 A1* | 7/2008 | Kwon ................... G02F 1/1309 349/143 |
| 2009/0273749 A1 | 11/2009 | Miyamoto et al. |
| 2009/0310051 A1* | 12/2009 | Kim ................. G02F 1/136204 349/40 |
| 2011/0025940 A1 | 2/2011 | Liu et al. |
| 2012/0268708 A1 | 10/2012 | Chida |
| 2012/0327338 A1 | 12/2012 | Kobayashi et al. |
| 2013/0342795 A1 | 12/2013 | Park et al. |
| 2014/0029230 A1* | 1/2014 | Oh ........................... H05K 1/14 361/803 |
| 2014/0225849 A1 | 8/2014 | Anno et al. |

FOREIGN PATENT DOCUMENTS

| | | |
|---|---|---|
| CN | 103513470 | 1/2014 |
| JP | 2003-66467 | 3/2003 |
| JP | 2006-171386 | 6/2006 |
| JP | 3946498 | 7/2007 |
| TW | 200527679 | 8/2005 |
| TW | 200712614 | 4/2007 |
| TW | 201005360 | 2/2010 |
| TW | I335482 | 1/2011 |
| TW | 201202812 | 1/2012 |
| TW | 201307945 | 2/2013 |
| TW | 201321851 | 6/2013 |
| TW | I408471 | 9/2013 |

OTHER PUBLICATIONS

Chinese language office action dated Dec. 28, 2015, issued in application No. TW 103137140.
Chinese language office action dated Mar. 1, 2016, issued in application No. TW 103132928.
Chinese language office action dated Dec. 10, 2015, issued in application No. TW 103140591.
Chinese language office action dated Oct. 15, 2015, issued in application No. TW 103141941.
Chinese language office action dated Nov. 10, 2015, issued in application No. TW 103133162.
Office Action dated Apr. 13, 2016, issued in U.S. Appl. No. 14/656,363.
Office Action dated Apr. 5, 2016, issued in U.S. Appl. No. 14/656,461.

* cited by examiner

DISPLAY DEVICE AND TEST PAD THEREOF

CROSS REFERENCE TO RELATED APPLICATIONS

This application claims priority of Taiwan Patent Application No. 103132928, filed on Sep. 24, 2014, U.S. Provisional Application No. 61/952,929, filed on Mar. 14, 2014, and U.S. Provisional Application No. 61/989,046, filed on May 6, 2014, the entireties of which are incorporated by reference herein.

BACKGROUND

Technical Field

The disclosure relates to a display device, and in particular to a display device with a test pad.

Description of the Related Art

As digital technology develops, display devices are becoming more popularly used in our society. For example, display devices have been applied to modern information and communication devices such as televisions, notebooks, computers, mobile phones and smartphones. In addition, each generation of display devices has been developed to be thinner, lighter, smaller and more fashionable.

However, when the resolution of the display panel is enhanced, the amount of signal output bumps required by a chip such as a driving unit increases. This means that the amount of output bump of the chip increases. Nevertheless, the area which could accommodate the wire electrically connecting to the bump is limited. In addition, some of the wires pass through a portion of the substrate below the chip, but the area of the portion of the substrate below the chip is also limited. Therefore, when the amount of output bump increases, not only the area used to accommodate the wires electrically connecting to the bump is insufficient, but also the portion of the substrate below the chip in which the wires pass through is insufficient.

Therefore, a display device which may solve the problem of insufficient area for the output wire while maintaining the reliability and yield is needed.

SUMMARY

The present disclosure provides a display device, including: a display region; and a non-display region adjacent to the display region, wherein the non-display region includes: a gate-driving circuit; a driving unit; and a test pad, wherein the driving unit electrically connects the gate-driving circuit through the test pad.

The present disclosure also provides a test pad, including: a conductive layer, wherein the conductive layer includes a first region and a second region; wherein the first region of the conductive layer directly contacts a wire, the second region of the conductive layer is separated apart from the first region of the conductive layer and the second region of the conductive layer is separated apart from the wire, wherein the first region of the conductive layer electrically connects to the second region of the conductive layer through a connecting layer.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
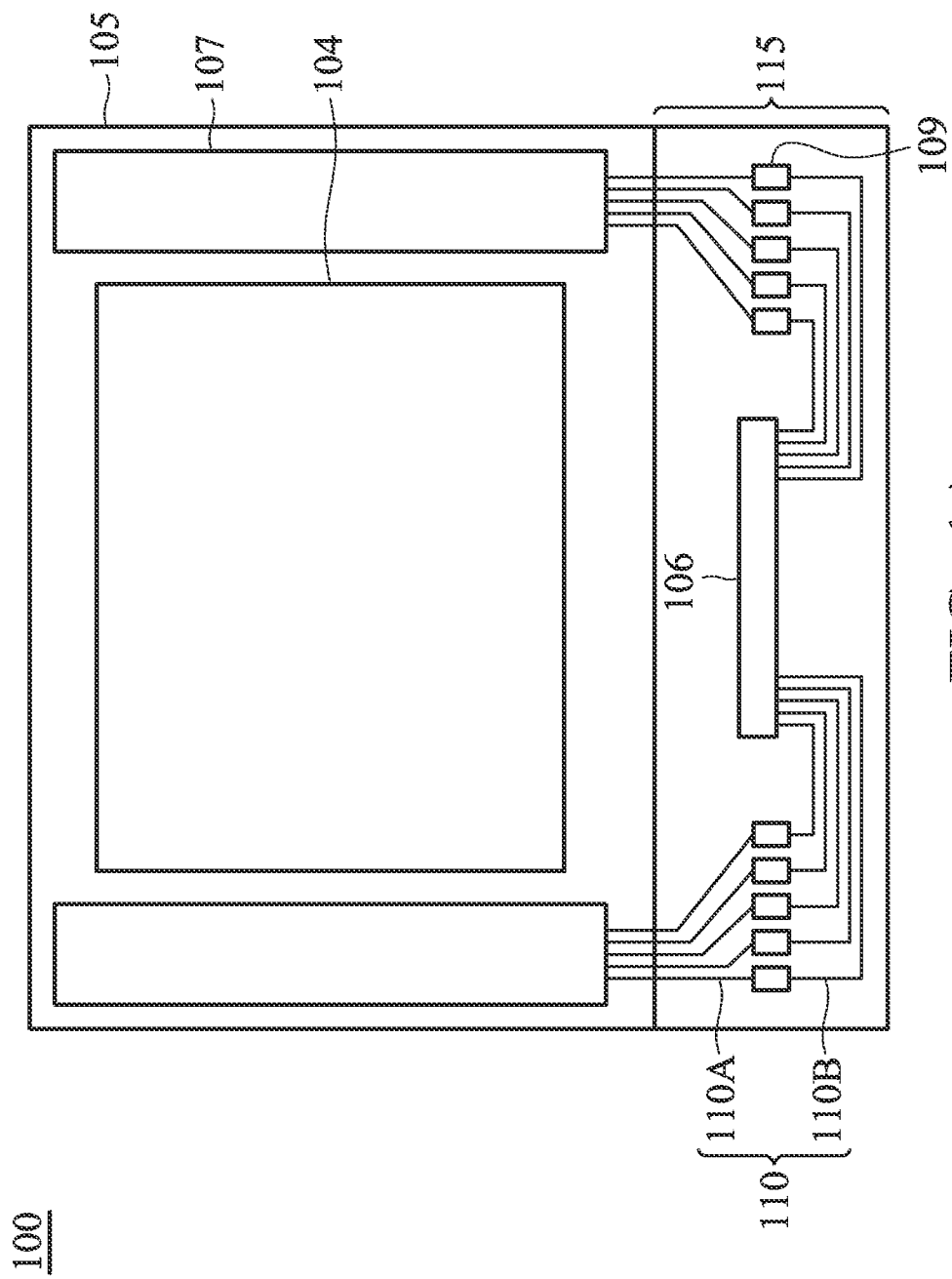
FIG. 1A is a top view of a display device in accordance with some embodiments of the present disclosure.

The display device and the test pad of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first insulating bump disposed on/over a second material layer", may indicate not only the direct contact of the first insulating bump and the second material layer, but also, a non-contact state with one or more intermediate layers between the first insulating bump and the second material layer. In the above situation, the first insulating bump may not directly contact the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate not only that the layer directly contacts the other layer, but also that the layer does not directly contact the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element at a "lower" side will become an element at a "higher" side.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about" or "substantially".

The embodiments of the present disclosure change the configuration of the wire in the display device to reduce the area occupied by the wire in the integrated circuit. In addition, the present disclosure also utilizes a patterned test pad to improve the reliability and yield of the display device.

First, a display device comprises a driving unit, a gate-driving circuit, a test pad and wires. The gate-driving circuit, a driving unit, the test pad and the wires are disposed on a substrate. The driving unit may be, but is not limited to, an integrated circuit (IC). The driving unit includes the gate-signal output bump. The gate-signal output bump is electrically connected to the gate-driving circuit through one wire and is electrically connected to the test pad through another wire. Accordingly, the two wires mentioned above occupy two regions of the driving unit (corresponding to region 113A and region 113B in FIG. 1B). When the amount of signal output contacts of the output bump increases as the resolution of the display panel is enhanced, not only the area used to accommodate the wire electrically connecting to the signal output contacts of the output bump would be insufficient, but also the portion of the substrate below the chip in which the wires pass through would be insufficient.

Therefore, in order to reduce the area occupied by the wire, another configuration of the wire in the display device is provided by the present disclosure. FIG. 1A is a top view of a display device in accordance with some embodiments of the present disclosure. As shown in FIG. 1A, the display device 100 includes a display region 104 and a non-display region 105 adjacent to the display region 104. The display region 104 is the region in the display device 100 in which the pixels including transistors display an image. The transistor may include, but is not limited to, an amorphous silicon thin film transistor or an LTPS thin film transistor. Therefore, the display region 104 is also referred to as a pixel-displaying region 104. The non-display region 105 is the region in the display device 100 except or other than the display region 104. In this embodiment, the non-display region 105 surrounds or encloses the display region 104. In addition, the non-display region 105 includes a gate-driving circuit (such as gate driver on panel, GOP) 107 disposed at the two opposite sides of the display region 104, a driving unit 106 and a test pad 109 disposed in the out lead bonding (OLB) region 115. In addition, the non-display region 105 further comprises a wire 110, and a portion of the wire 110 is disposed in the out lead bonding region 115. In other embodiments, the gate-driving circuit 107 may be disposed only at one side of the display region 104.

The display device 100 may include, but is not limited to, a liquid-crystal display, such as a thin film transistor liquid crystal display. The driving unit 106 may provide a source signal to the pixels (not shown) in the display region 104 and/or provide a gate signal to the gate-driving circuit 107. The gate-driving circuit 107 may provide a scanning pulse signal to the pixels in the display region 104 and control the pixels (not shown) disposed in the display region 104 cooperating with the aforementioned source signal to display an image in the display device 100. The gate-driving circuit 107 may comprise, but is not limited to, a gate-on-panel (GOP) or any other suitable gate-driving circuit.

In addition, the driving unit 106 is electrically connected to the gate-driving circuit 107 through the test pad 109. The test pad 109 may be electrically connected to the gate-driving circuit 107 and the driving unit 106 by any suitable method. For example, in one embodiment, as shown in FIG. 1A, the test pad 109 is electrically connected to the gate-driving circuit 107 and the driving unit 106 through the wire 110.

Figure 1B:
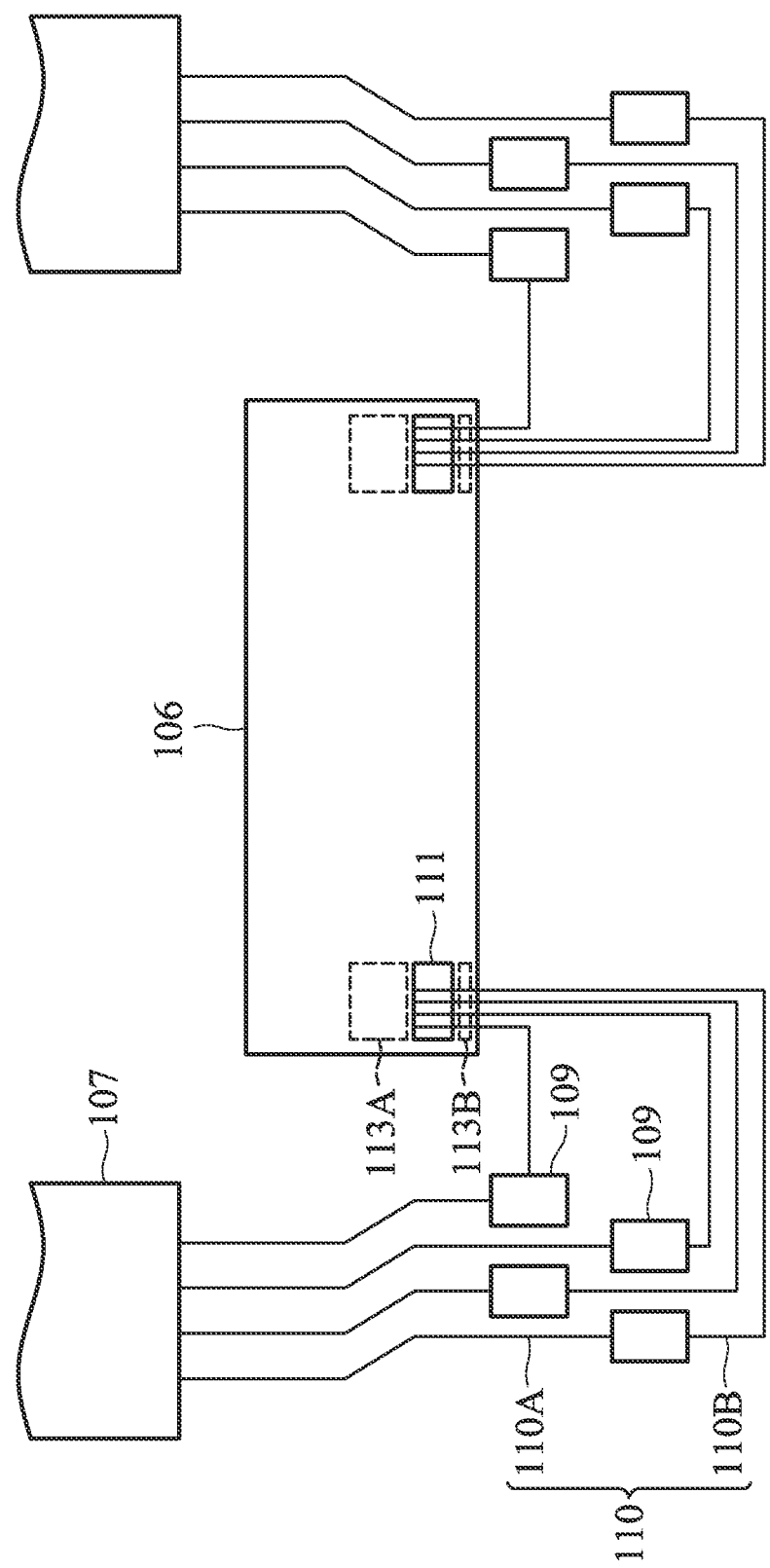
FIG. 1B is an enlarged figure of a portion of the display device in FIG. 1A.

By electrically connecting the driving unit 106 to the gate-driving circuit 107 through the test pad 109, the present disclosure may reduce the area occupied by the wire 110 in the driving unit 106, particular as illustrated in FIG. 1B, which is an enlarged figure of a portion of the display device 100 in FIG. 1A. As shown in FIG. 1B, the gate-signal output bump 111 of the driving unit 106 is electrically connected to the test pad 109 through the wire 110B. Then the test pad 109 is electrically connected to the gate-driving circuit 107 through another wire 110A. Compared to the aforementioned display device known to the applicant, the wires 110A and 110B in the known display device pass through the regions 113A and 113B respectively. Therefore, the area of the regions 113A and 113B must be occupied at the lower portion of the driving unit 106. However, the wire 110 of the present disclosure only occupies the area of the region 113B in the driving unit 106 and does not occupy the area of the region 113A. As the amount of signal output wire of the driving unit 106 increases when the resolution of the display panel is enhanced, the region 113A may be used to dispose other output wire. Therefore, the problem of there being insufficient area for the output wire in the chip such as the driving unit may be solved.

Furthermore, in order to improve the reliability and yield of the display device 100 in FIG. 1A, the test pad 109 of the display device 100 in the present disclosure may be a patterned test pad. In particular, in the testing step for testing the function of the display device 100, the test pad 109 must be touched by a probe, which would result in a hole in the conductive layer of the test pad 109 when the probe contacts the test pad 109. The hole in the conductive layer would be corroded and damaged by water and oxygen as time goes by, resulting in an open circuit or a malfunction of the wire between the driving unit 106 and the gate-driving circuit 107, which in turn would lower the reliability and yield of the display device 100. In order to solve the above technical problem, the test pad of the present disclosure may be patterned to be divided into a plurality of functional regions and sections which are separated apart from each other, and these functional regions and sections are electrically connected to each other through a connecting layer.

Figure 2:
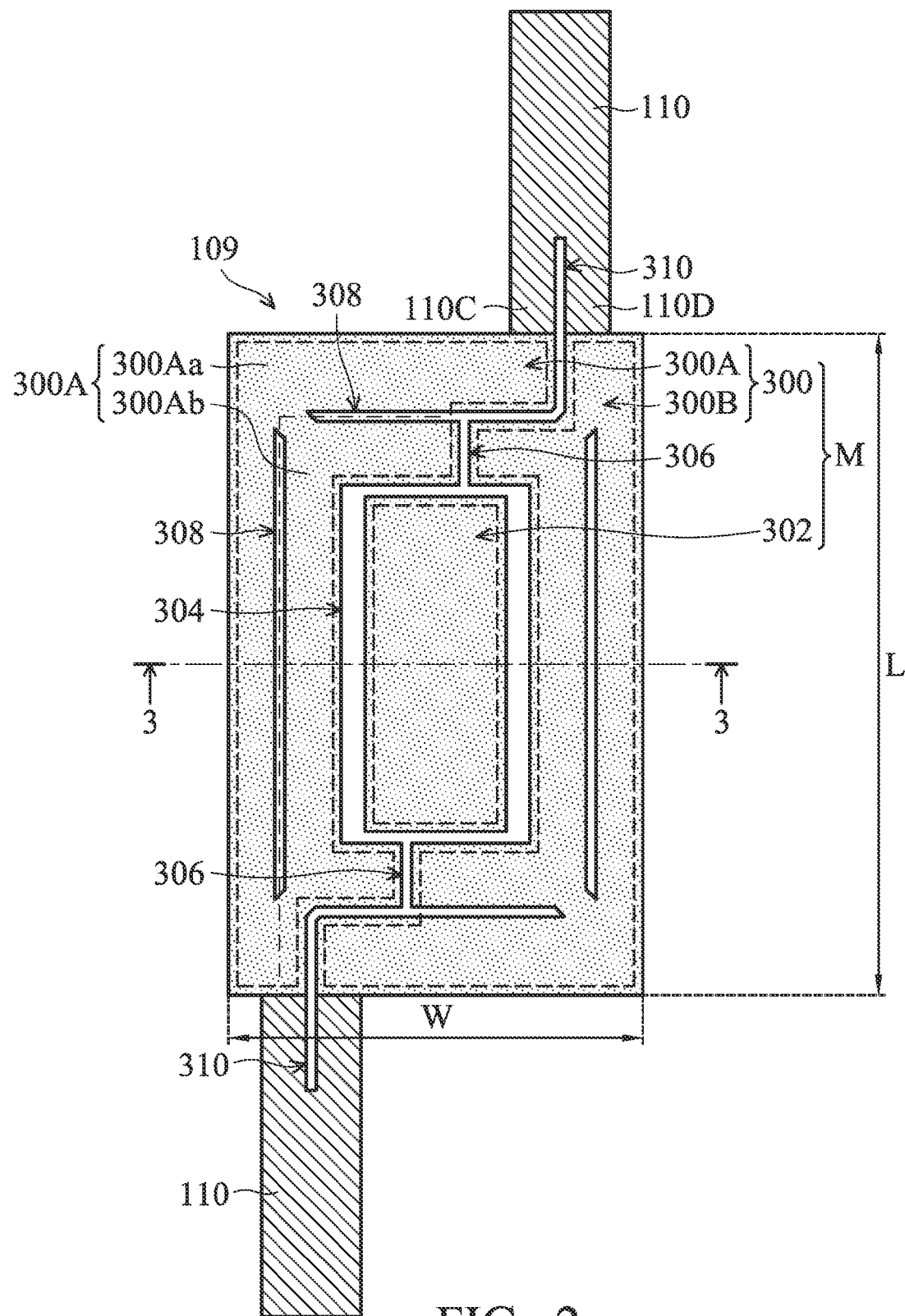
FIG. 2 is a top view of a test pad in accordance with some embodiments of the present disclosure.
Figure 3A:
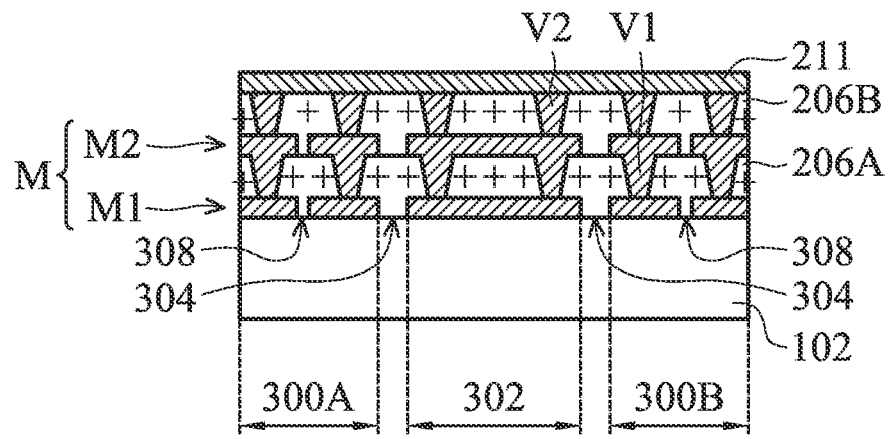
FIGS. 3A-3B are cross-sectional views of the test pad along line 3-3 in FIG. 2.

Referring to FIG. 2 and FIG. 3A, FIG. 2 is a top view of a test pad 109 in accordance with some embodiments of the present disclosure and FIG. 3A is a cross-sectional view of the test pad 109 along line 3-3 in FIG. 2. As shown in FIGS. 2 and 3A, the test pad 109 includes a conductive layer M disposed over a substrate 102, and the conductive layer M comprises a first region 300 and a second region 302. The first region 300 of the conductive layer M is used to transmit the signal between two wires 110. The second region 302 of the conductive layer M is used to contact the probe in the testing step. The first region 300 of the conductive layer M directly contacts the wire 110, whereas the second region 302 of the conductive layer M is separated apart from the first region 300 of the conductive layer M. In other words, the first region 300 of the conductive layer M does not connect or contact the second region 302 of the conductive layer M. For example, the first region 300 of the conductive layer M is separated apart from the second region 302 of the conductive layer M by a main gap 304. In addition, the second region 302 of the conductive layer M is separated apart from the wire 110. In other words, the second region 302 of the conductive layer M does not connect or contact the first region 300 of the conductive layer M and the wire 110. The first region 300 is electrically connected to the second region 302 by another connecting layer through a contact via.

Since the second region 302 of the conductive layer M, which is used to contact the probe in the testing step, is separated apart from the first region 300 of the conductive layer M, which is used to transmit the signal, and the wire 110, the corrosion after the testing step is limited to the second region 302 of the conductive layer M. Therefore, the first region 300 of the conductive layer M and the wire 110 would not be corroded. Accordingly, even if the corrosion happens after the testing step, the patterned test pad 109 of the present disclosure may still transmit signals through the first region 300 of the conductive layer M and the wire 110. Therefore, the patterned test pad 109 may improve the reliability and yield of the display device 100.

In addition, the ratio of the area of the first region 300 to that of the second region 302 of the conductive layer M ranges from about 2 to 1000, for example from about 4 to 10. If the area ratio of the first region 300 to the second region 302 is too large, for example greater than 1000, the area of the second region 302 of the conductive layer M which is used to contact the probe would be too small, such that it would be difficult to perform the testing step. However, if the area ratio of the first region 300 to the second region 302 is too small, for example smaller than 2, the area of the first region 300 of the conductive layer M which is used to transmit the signal would be too small, which in turn increases the resistance. In addition, the size of the test pad 109 may range from about 100 μm to 1000 μm, for example from about 500 μm to 800 μm. The size of the test pad 109 refers to the length L or width W of the test pad 109.

Referring to FIG. 3A, the conductive layer M is disposed over the substrate 102. The conductive layer M may comprise, but is not limited to, a metal layer. The material of the metal layer may include, but is not limited to, a single layer or multiple layers of copper, aluminum, tungsten, gold, chromium, nickel, platinum, titanium, iridium, rhodium, a combination thereof, an alloy thereof, or other metal materials with good conductivity. In other embodiments, the conductive layer M includes a nonmetal material. The conductive layer M may include any conductive material and would suffer a corrosion expansion after being corroded, and the conductive material could be used as the conductive layer M of the embodiments mentioned above. For example, in the embodiment shown in FIG. 3A, the conductive layer M is a double-layer conductive layer, which includes the first conductive layer M1 and the second conductive layer M2. In one embodiment, the materials of the first conductive layer M1 and the second conductive layer M2 are the same. However, in other embodiments, the materials of the first conductive layer M1 and the second conductive layer M2 may be different. An interlayer dielectric (ILD) layer 206A is disposed between the first conductive layer M1 and the second conductive layer M2. The first conductive layer M1 and the second conductive layer M2 have the same pattern, and the corresponding patterns are electrically connected to each other through the via V1 in the interlayer dielectric layer 206A. The material of the interlayer dielectric layer 206A may include, but is not limited to, silicon oxide, silicon nitride, silicon oxynitride, boron phosphorus silicate glass (BPSG), phosphorus silicate glass (PSG), spin-on glass (SOG), or any other suitable dielectric material, or a combination thereof. The material which electrically connects the first conductive layer M1 and the second conductive layer M2 through the via V1 may include, but is not limited to, the material of the first conductive layer M1, the material of the second conductive layer M2, a combination thereof, copper, aluminum, tungsten, doped poly-silicon, or any other suitable conductive material, or a combination thereof.

In addition, in the embodiment shown in FIG. 3A, the first region 300 of the conductive layer M may be electrically connected to the second region 302 of the conductive layer M by a connecting layer 211. Since the connecting layer 211 has a higher anticorrosive ability than the conductive layer, and the first region 300 and the second region 302 are electrically connected by a connecting layer 211 rather than by direct contact, the connecting layer 211 would protect the conductive layer from being corroded by water and oxygen. The material of the connecting layer 211 may include, but is not limited to, transparent conductive material such as indium tin oxide (ITO), tin oxide (TO), indium zinc oxide (IZO), indium gallium zinc oxide (IGZO), indium tin zinc oxide (ITZO), antimony tin oxide (ATO), antimony zinc oxide (AZO), a combination thereof, or any other suitable transparent conductive oxides with higher anticorrosive ability. The connecting layer 211 may be electrically connected to the conductive layer M1 or the conductive layer M2 by the via V2 in the interlayer dielectric layer 206B to electrically connect the first region 300 of the conductive layer M and the second region 302 of the conductive layer M.

Figure 3B:
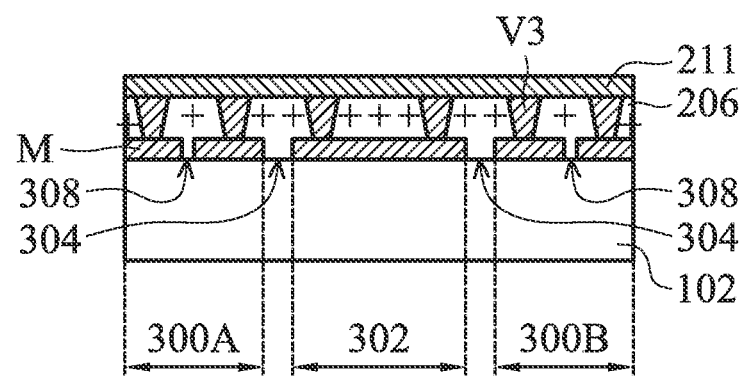

In addition, the conductive layer M may also be a single-layer conductive layer. As shown in FIG. 3B, only one single conductive layer M is disposed over the substrate 102, and the first region 300 of the conductive layer M may be electrically connected to the second region 302 of the conductive layer M by the connecting layer 211 through the via. For example, the connecting layer 211 may be electrically connected to the conductive layer M by the via V3 in the interlayer dielectric layer 206 to electrically connect the first region 300 of the conductive layer M to the second region 302 of the conductive layer M.

Referring to FIG. 2, in the embodiment shown in FIG. 2, the main gap 304 may surround the second region 302 of the conductive layer M. The width of the main gap 304 may range from about 10 μm to 100 μm, for example from about 20 μm to 40 μm. Alternatively, the ratio of the width of the main gap 304 to the width W of the test pad 109 may range from about 0.01 to 0.25, for example from about 0.025 to 0.1. If the width of the main gap 304 is too large, for example if the width of the main gap 304 is larger than 100 μm or the ratio of the width of the main gap 304 to the width W of the test pad 109 is larger than 0.25, the main gap 304 would occupy too much area of the test pad 109, which in turn reduces the area of the conductive layer M and increases the resistance. However, if the width of the main gap 304 is too small, for example if the width of the main gap 304 is smaller than 10 μm or the ratio of the width of the main gap 304 to the width W of the test pad 109 is smaller than 0.01, the main gap 304 could not effectively prevent the first region 300 of the conductive layer M from being corroded. For example, when the width of the main gap 304 is too small, if the probe contacts the main gap 304 due to shifting, the first region 300 of the conductive layer M would probably be exposed such that the first region 300 of the conductive layer M would be corroded.

In addition, the first region 300 of the conductive layer M also surrounds or encloses the second region 302 of the conductive layer M. The first region 300 of the conductive layer M may be divided into a plurality of sections which are separated apart from each other by one or more first gaps 306. In other words, the plurality of sections such as the sections 300A and 300B shown in FIG. 2 does not contact each other. The plurality of sections 300A and 300B which are separated apart from each other may further improve the reliability and yield of the display device 100. In particular, in the testing step, the probe may contact the first region 300 of the conductive layer M due to shifting. Therefore, the first region 300 of the conductive layer M may also be corroded after the testing step. The plurality of sections 300A and 300B which are separated apart from each other may limit the corrosion in the section touched by the probe, and the signal may still be transmitted by other sections of the first region 300 of the conductive layer M which are not corroded. For example, if the probe contacts section 300A, since sections 300A and 300B are separated apart from each other, the corrosion is limited to section 300A, and the signal can still be transmitted by section 300B, which is not corroded. Therefore, dividing the first region 300 of the conductive layer M into a plurality of sections which are separated apart from each other by one or more first gaps 306 may further improve the reliability and yield of the display device 100.

The width of the first gap 306 may range from about 3 μm to 50 μm, for example from about 10 μm to 20 μm. Alternatively, the ratio of the width of the first gap 306 to the width W of the test pad 109 may range from about 0.0033 to 0.1, for example from about 0.01 to 0.02. If the width of the first gap 306 is too large, for example if the width of the first gap 306 is larger than 50 μm or the ratio of the width of the first gap 306 to the width W of the test pad 109 is larger than 0.1, the first gap 306 would occupy too much area of the test pad 109, which in turn reduces the area of the conductive layer M and increases the resistance. However, if the width of the first gap 306 is too small, for example if the width of the first gap 306 is smaller than 3 μm or the ratio of the width of the first gap 306 to the width W of the test pad 109 is smaller than 0.0033, the first gap 306 could not effectively separate the sections 300A and 300B.

In addition, the plurality of sections 300A and 300B in the first region 300, which are separated apart from each other, may further include one or more in-section gaps 308. The in-section gaps 308 may divide the sections 300A and 300B into a plurality of sub-sections. The sub-sections are substantially separated apart from each other, and the sub-sections connect to each other only by a small part or a small portion of the sub-sections. For example, section 300A may be divided into a plurality of sub-sections 300Aa and 300Ab by a plurality of in-section gaps 308. The sub-sections 300Aa and 300Ab are substantially separated apart from each other, and the sub-sections 300Aa and 300Ab physically connect to each other only by a small part or a small portion located at the upper left and lower left in the figure. The plurality of the sub-sections 300Aa and 300Ab which are substantially separated apart from each other may further improve the reliability and yield of the display device 100. For example, if the probe contacts the sub-section 300Ab, since the sub-sections 300Aa and 300Ab connect to each other only by a small part or a small portion, the corrosion is limited to sub-section 300Ab. Even if the sub-section 300Ab is damaged due to the corrosion, the signal may still be transmitted by the sub-section 300Aa which are not corroded. Therefore, dividing the plurality of sections 300A and 300B into a plurality of sub-sections such as sub-sections 300Aa and 300Ab by the in-section gaps 308 may further improve the reliability and yield of the display device 100.

The width of the in-section gap 308 may range from about 3 μm to 50 μm, for example from about 10 μm to 20 μm. Alternatively, the ratio of the width of the in-section gap 308 to the width W of the test pad 109 may range from about 0.0033 to 0.1, for example from about 0.01 to 0.02. If the width of the in-section gap 308 is too large, for example if the width of the in-section gap 308 is larger than 50 μm or the ratio of the width of the in-section gap 308 to the width W of the test pad 109 is larger than 0.1, the in-section gap 308 would occupy too much area of the test pad 109, which in turn reduces the area of the conductive layer M and increases the resistance. However, if the width of the in-section gap 308 is too small, for example if the width of the in-section gap 308 is smaller than 3 μm or the ratio of the width of the in-section gap 308 to the width W of the test pad 109 is smaller than 0.0033, the sub-sections 300Aa and 300Ab would be too close and the in-section gap 308 could not effectively prevent corrosion.

Referring to FIG. 2, the material of the wire 110 may include, but is not limited to, a single layer or multiple layers of copper, aluminum, tungsten, gold, chromium, nickel, platinum, titanium, iridium, rhodium, a combination thereof, an alloy thereof, or other metal materials with good conductivity. In addition, the wire 110 may further include one or more in-wire gaps 310. In one embodiment, at least one in-wire gap 310 connects to at least one first gap 306. The in-wire gap 310 may further improve the reliability and yield of the display device 100. In particular, if the corrosion extends from the sections 300A of the first region 300 to the first-section wire 110C, the in-wire gap 310 may limit the corrosion to the first-section wire 110C, and the second-section wire 110D would not be corroded. Accordingly, since the wire 110 would not be corroded completely, the in-wire gap 310 may further improve the reliability and yield of the display device 100. In other embodiments, the connecting layer 211 may also be disposed above or overlapped the wire 110.

The width of the in-wire gap 310 may range from about 3 μm to 50 μm, for example from about 10 μm to 20 μm. Alternatively, the ratio of the width of the in-wire gap 310 to the width of the wire 110 may range from about 0.02 to 0.5, for example from about 0.05 to 0.2. If the width of the in-wire gap 310 is too large, for example if the width of the in-wire gap 310 is larger than 50 μm or the ratio of the width of the in-wire gap 310 to the width of the wire 110 is larger than 0.5, the risk of an open circuit occurring in the wire 110 would increase due to the overly large size of the in-wire gap 310. However, if the width of the in-wire gap 310 is too small, for example if the width of the in-wire gap 310 is smaller than 3 μm or the ratio of the width of the in-wire gap 310 to the width of the wire 110 is smaller than 0.02, the in-wire gap 310 would not effectively prevent the corrosion from extending between the first-section wire 110C and the second-section wire 110D at the opposite sides of the in-wire gap 310. Alternatively, the ratio of the length of the in-wire gap 310 to the length L of the test pad 109 may range from about 0.03 to 3. The length of the in-wire gap 310 may be as short as 3 μm. Alternatively, the ratio of the length of the in-wire gap 310 to the length L of the test pad 109 may be as small as 0.03. The length of the in-wire gap 310 may be as long as the length of the wire 110 in the out lead bonding region 115. If the length of the in-wire gap 310 is too short, for example if the length of the in-wire gap 310 being shorter than 3 μm or the ratio of the length of the in-wire gap 310 to the length L of the test pad 109 is smaller than 0.03, the in-wire gap 310 could not effectively separate the first-section wire 110C and the second-section wire 110D. However, length of the in-wire gap 310 cannot be longer than the length of the wire 110 in the out lead bonding region 115.

It should be noted that the exemplary embodiment set forth in FIG. 2 is merely for the purpose of illustration. In addition to the embodiment set forth in FIG. 2, the test pad could have other patterns as shown in FIGS. 4-7. The inventive concept and scope are not limited to the exemplary embodiment shown in FIG. 2.

Figure 4:
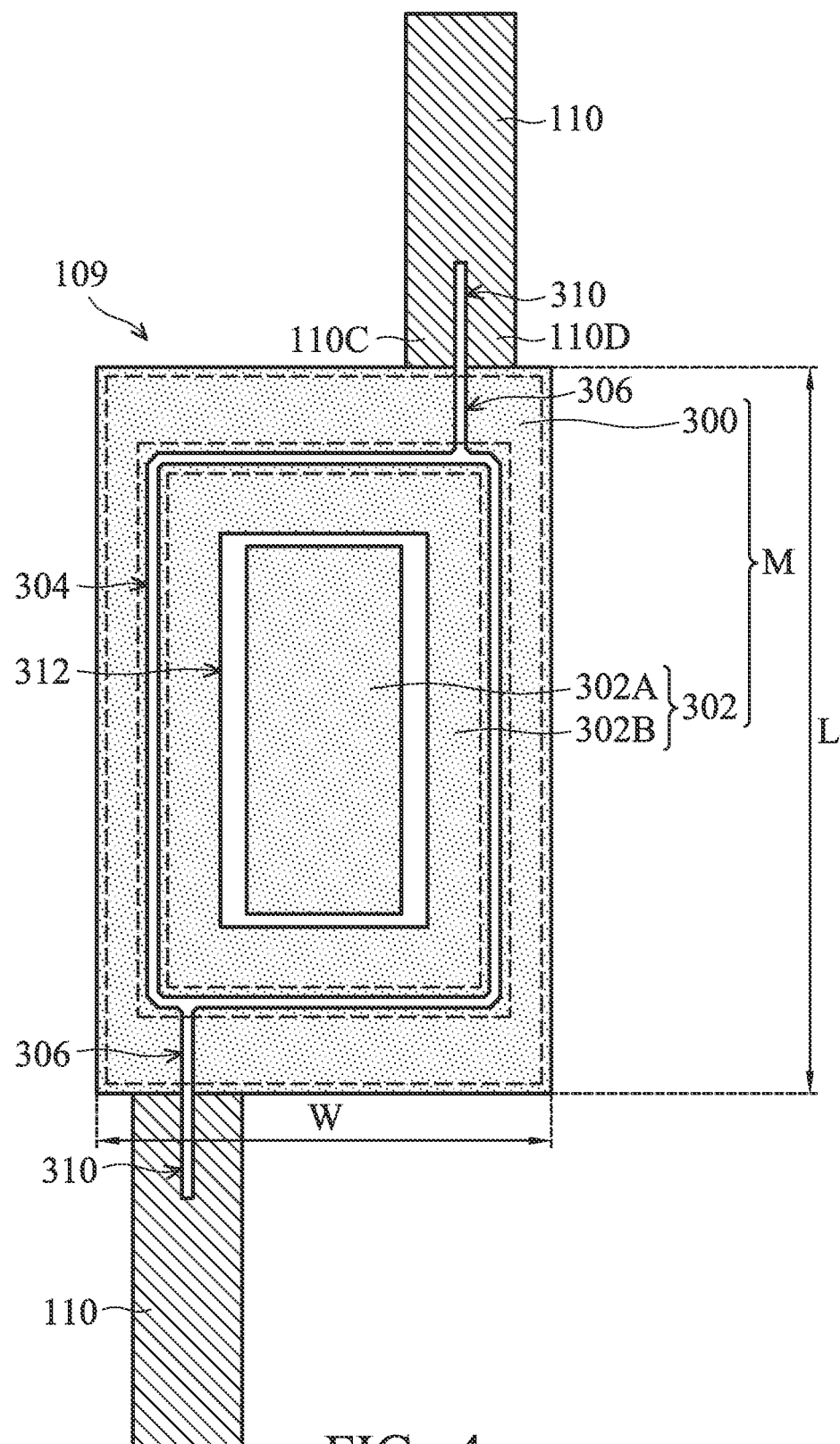
FIG. 4 is a top view of a test pad in accordance with another embodiment of the present disclosure.

Referring to FIG. 4, which is a top view of a test pad in accordance with another embodiment of the present disclosure. The difference between the embodiments shown in FIGS. 2 and 4 is that the second region 302 of the conductive layer M is also divided into a plurality of sections 302A and 302B which are separated apart from each other by one or more second gaps 312. In other words, the plurality of sections 302A and 302B do not directly contact each other. In addition, in the embodiment shown in FIG. 4, the first region 300 of the conductive layer M does not include an in-section gap.

The plurality of sections 302A and 302B which are separated apart from each other may further improve the reliability and yield of the display device 100. For example, when the probe touches the sections 302A, the corrosion is limited to section 302A, and the section 302B which is not corroded could still transmit signal through the via and the connecting layer. Therefore, the plurality of sections 302A and 302B may further improve the reliability and yield of the display device 100 and may further reduce the resistance.

The width of the second gap 312 may range from about 10 μm to 100 μm, for example from about 30 μm to 50 μm. Alternatively, the ratio of the width of the second gap 312 to the width W of the test pad 109 may range from about 0.01 to 0.25, for example from about 0.05 to 0.1. If the width of the second gap 312 is too large, for example if the width of the second gap 312 is larger than 100 μm or the ratio of the width of the second gap 312 to the width W of the test pad 109 is larger than 0.25, the second gap 312 would occupy too much area of the test pad 109, which in turn reduces the area of the conductive layer M and increases the resistance. However, if the width of the second gap 312 is too small, for example if the width of the second gap 312 is smaller than 10 μm or the ratio of the width of the second gap 312 to the width W of the test pad 109 is smaller than 0.01, the second gap 312 could not effectively separate the sections 302A and 302B.

Figure 5:
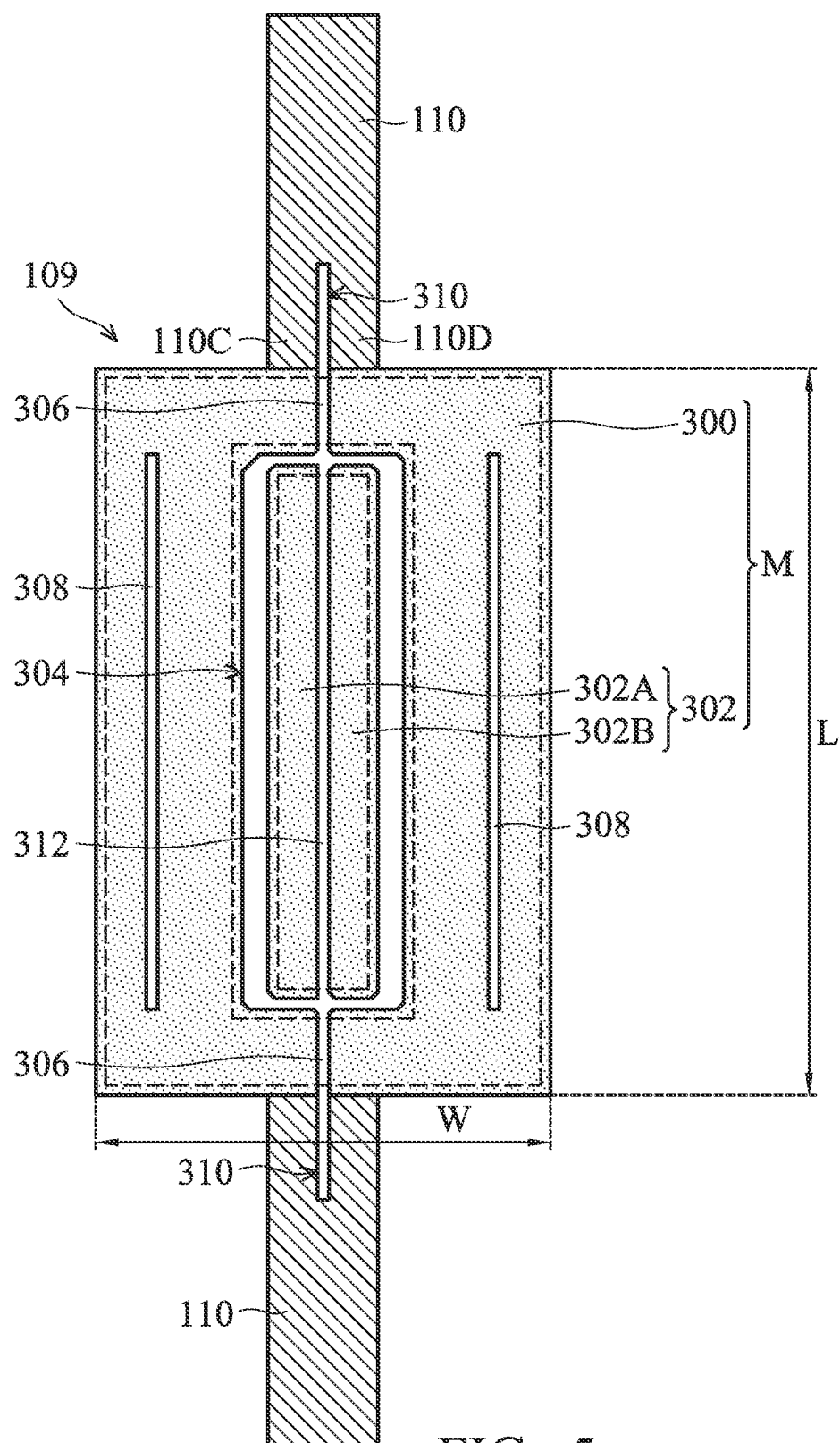
FIG. 5 is a top view of a test pad in accordance with another embodiment of the present disclosure.

Referring to FIG. 5, which is a top view of a test pad in accordance with another embodiment of the present disclosure. In the embodiment shown in FIG. 5, the second region 302 of the conductive layer M is also divided into a plurality of sections 302A and 302B which are separated apart from each other by one or more second gaps 312. The difference between the embodiment shown in FIG. 5 and the embodiment shown in FIG. 4 is that the second gap 312 of this embodiment is aligned with the first gap 306 and the in-wire gap 310.

Figure 6:
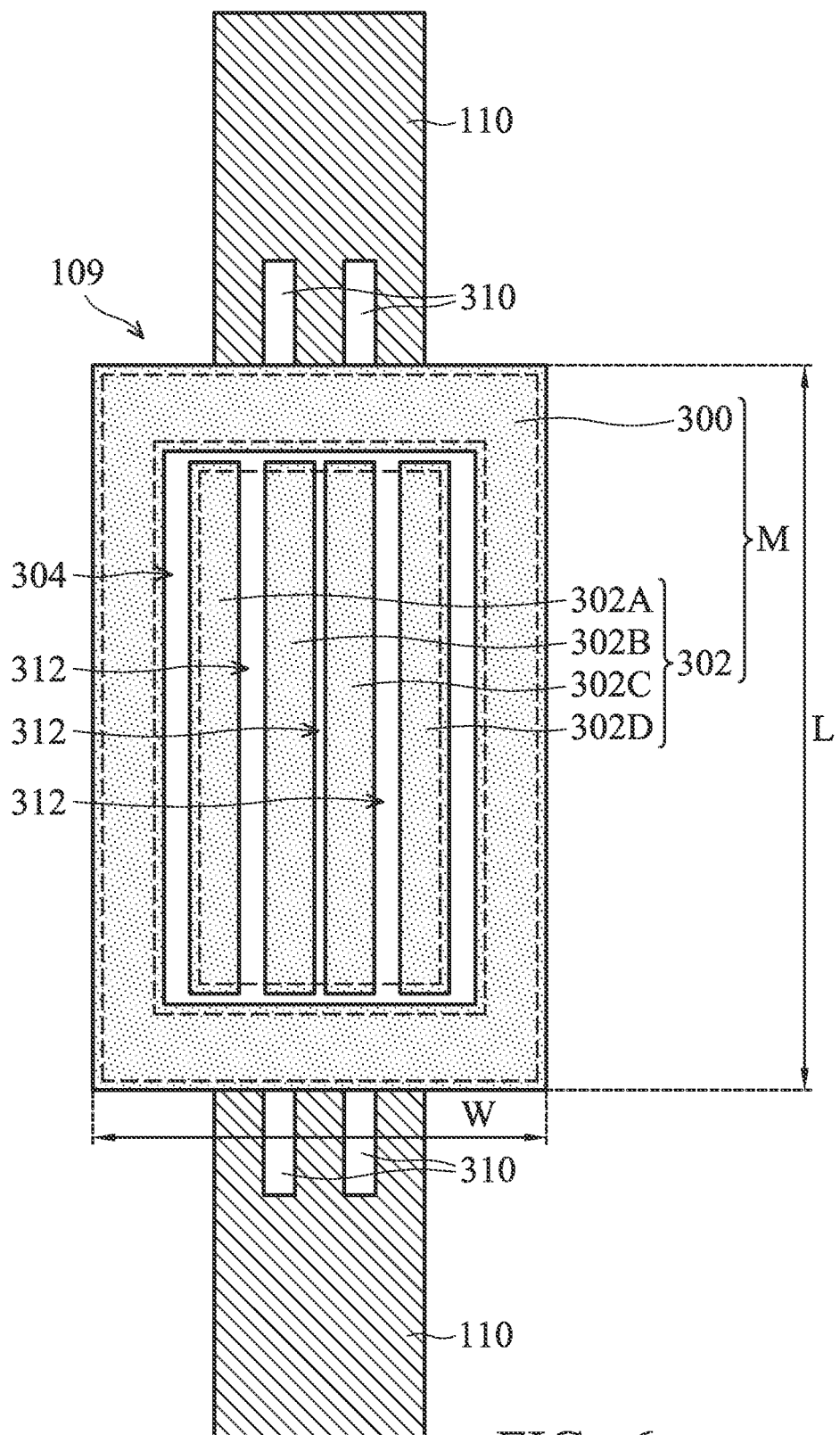
FIG. 6 is a top view of a test pad in accordance with another embodiment of the present disclosure.

Referring to FIG. 6, which is a top view of a test pad in accordance with another embodiment of the present disclosure. The difference between the embodiment shown in FIG. 6 and the embodiment shown in FIG. 5 is that the second region 302 of the conductive layer M is divided into four sections 302A, 302B, 302C and 302D which are separated apart from each other by three second gaps 312. In addition, the wire 110 includes two in-wire gaps 310, and the first region 300 of the conductive layer M does not include the first gap.

Figure 7:
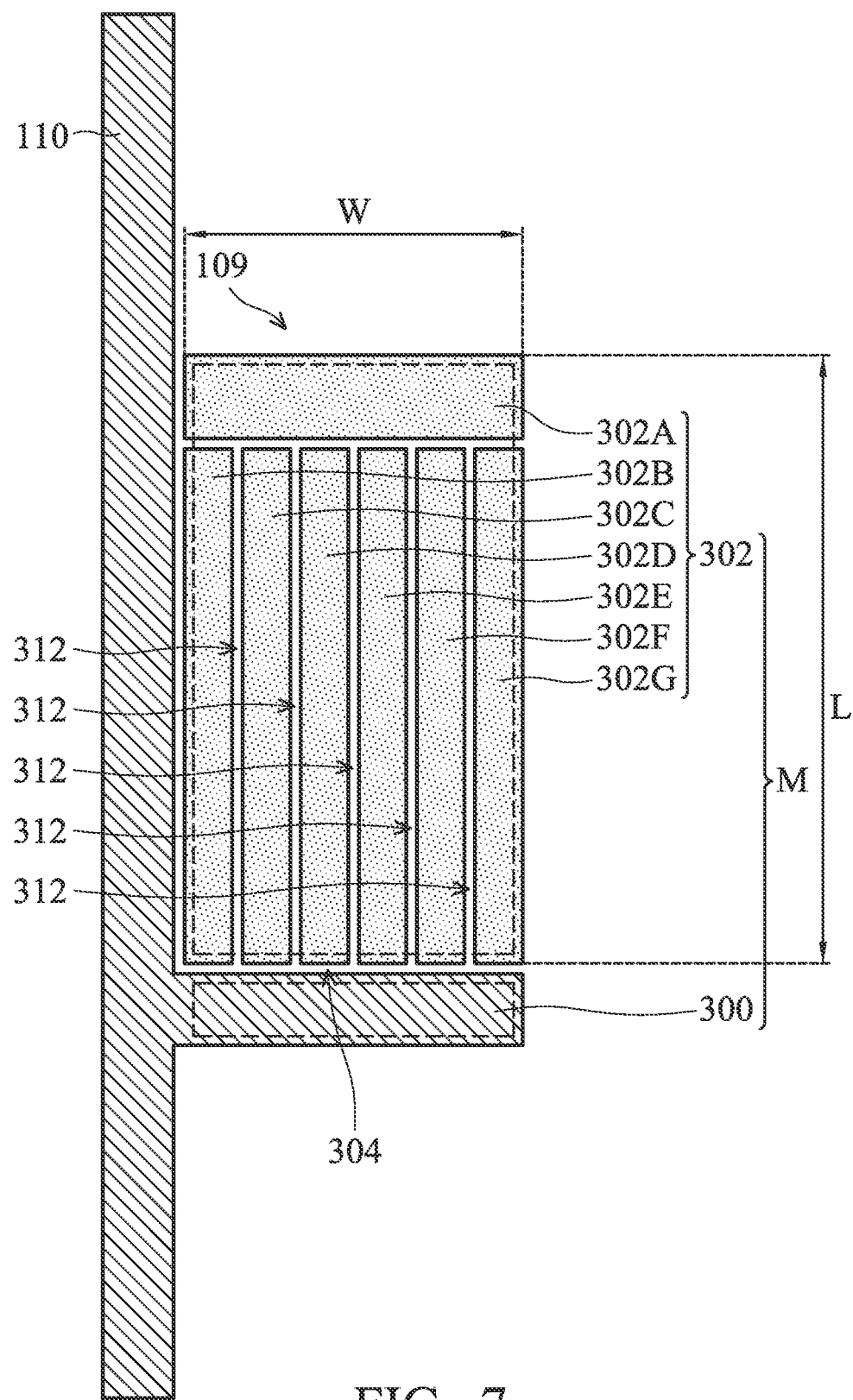
FIG. 7 is a top view of a test pad in accordance with another embodiment of the present disclosure.

Referring to FIG. 7, which is a top view of a test pad in accordance with another embodiment of the present disclosure. The difference between the embodiment shown in FIG. 7 and the embodiments shown in FIGS. 2 and 4-6 is that the first region 300 of the conductive layer M does not surround or enclose the second region 302 of the conductive layer M. Instead, the first region 300 of the conductive layer M is disposed at one side of the second region 302 of the conductive layer M. In addition, the second region 302 of the conductive layer M is divided into seven sections 302A, 302B, 302C, 302D, 302E, 302F and 302G which are separated apart from each other by six second gaps 312. In other embodiments, the shape of the second gap 312 is not limited to a linear shape, and the division manner is not limited to that shown in the above embodiments. Any division manner which may divide the second region 302 of the conductive layer M into a plurality of the sections which are separated apart from each other may be used in the present disclosure.

In summary, by electrically connecting the driving unit to the gate-driving circuit through the test pad, the present disclosure may reduce the area occupied by the wire in the driving unit. Therefore, the problem of insufficient area for the wire in the driving unit happened as the resolution of the display panel is enhanced may be solved. In addition, the present disclosure utilizes the patterned test pad to limit the corrosion happened after the testing step in a portion of the patterned test pad, which in turn improves the reliability and yield of the display device.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A display device, comprising:
a display region; and
a non-display region adjacent to the display region, wherein the non-display region comprises:
a gate-driving circuit;
a driving unit; and
a test pad, wherein the driving unit is electrically connected to the gate-driving circuit through the test pad.
2. The display device as claimed in claim 1, wherein the test pad electrically connects the gate-driving circuit and the driving unit through a wire, and the test pad comprises a conductive layer, wherein the conductive layer comprises a first region and a second region which are electrically connected to each other,
wherein the first region of the conductive layer directly contacts the wire, wherein the second region of the conductive layer is separated apart from the first region of the conductive layer, and the second region of the conductive layer is separated apart from the wire.

3. The display device as claimed in claim 2, wherein the first region of the conductive layer electrically connects the second region of the conductive layer through a connecting layer.

4. The display device as claimed in claim 2, wherein the first region of the conductive layer is separated apart from the second region of the conductive layer by a main gap.

5. The display device as claimed in claim 4, wherein the main gap surrounds the second region of the conductive layer.

6. The display device as claimed in claim 2, wherein the first region of the conductive layer is divided into a plurality of sections which are separated apart from each other by one or more first gaps.

7. The display device as claimed in claim 6, wherein the plurality of sections in the first region which are separated apart from each other further comprise one or more in-section gaps.

8. The display device as claimed in claim 2, wherein the second region of the conductive layer is divided into a plurality of sections which are separated apart from each other by one or more second gaps.

9. The display device as claimed in claim 2, wherein the wire comprises one or more in-wire gaps.

10. The display device as claimed in claim 9, wherein when the first region of the conductive layer comprises one or more first gaps, at least one of the in-wire gap connects to at least one of the first gap.

11. A test pad, comprising:
a conductive layer, wherein the conductive layer comprises a first region and a second region;
wherein the first region of the conductive layer directly contacts a wire, the second region of the conductive layer is separated apart from the first region of the conductive layer and the second region of the conductive layer is separated apart from the wire, wherein the first region of the conductive layer electrically connects to the second region of the conductive layer through a connecting layer.

12. The test pad as claimed in claim 11, wherein an area ratio of the first region to the second region ranges from about 2 to 1000.

13. The test pad as claimed in claim 11, wherein the first region of the conductive layer is separated apart from the second region of the conductive layer by a main gap.

14. The test pad as claimed in claim 13, wherein the main gap surrounds the second region of the conductive layer.

15. The test pad as claimed in claim 11, wherein the first region of the conductive layer is divided into a plurality of sections which are separated apart from each other by one or more first gaps.

16. The test pad as claimed in claim 15, wherein the plurality of sections in the first region which are separated apart from each other further comprise one or more in-section gaps.

17. The test pad as claimed in claim 11, wherein the second region of the conductive layer is divided into a plurality of sections which are separated apart from each other by one or more second gaps.

18. The test pad as claimed in claim 11, wherein the wire comprises one or more in-wire gaps.

19. The test pad as claimed in claim 18, wherein when the first region of the conductive layer comprises one or more first gaps, at least one of the in-wire gap connects to at least one of the first gap.

20. The test pad as claimed in claim 11, wherein the conductive layer comprises metal, and the connecting layer comprises transparent conductive oxides.

* * * * *